United States Patent [19]
Perron

[11] Patent Number: 5,837,586
[45] Date of Patent: Nov. 17, 1998

[54] 4-(ALKOXYHYDROXY)STYRYL TRIAZINE PHOTINITIATORS AND PHOTO SENSITIVE COMPOSITION

[75] Inventor: Paul A. Perron, Springfield, Mass.

[73] Assignee: Kodak Polychrome Graphics Company, Ltd., Norwalk, Conn.

[21] Appl. No.: 801,735

[22] Filed: Feb. 14, 1997

[51] Int. Cl.⁶ .......................... G03C 1/725; C07D 251/00
[52] U.S. Cl. .................................. 430/285.1; 430/281.1; 430/302; 430/320; 430/920; 430/926; 544/180; 544/216
[58] Field of Search .................................. 544/180, 216; 430/281.1, 320, 920, 302, 926, 285.1; 101/457

[56] References Cited

U.S. PATENT DOCUMENTS

| | | | |
|---|---|---|---|
| 3,905,815 | 9/1975 | Bonham | 96/68 |
| 3,954,475 | 5/1976 | Bonham et al. | 96/67 |
| 3,987,037 | 10/1976 | Bonham et al. | 260/240 |
| 4,189,323 | 2/1980 | Buhr | 430/281 |
| 4,258,123 | 3/1981 | Nagashima et al. | 430/281 |
| 4,476,215 | 10/1984 | Kausch | 430/281 |
| 4,507,382 | 3/1985 | Rousseau et al. | 430/275 |
| 4,559,401 | 12/1985 | Rowe et al. | 544/216 |
| 4,619,998 | 10/1986 | Buhr | 544/193.1 |
| 4,696,888 | 9/1987 | Buhr | 430/270 |
| 4,772,534 | 9/1988 | Kawamura et al. | 430/176 |
| 4,826,753 | 5/1989 | Higashi et al. | 430/281 |
| 4,837,128 | 6/1989 | Kawamma et al. | 430/281 |
| 4,851,319 | 7/1989 | Walls et al. | 430/157 |
| 4,912,218 | 3/1990 | Coyle et al. | 544/216 |
| 4,933,452 | 6/1990 | White et al. | 544/204 |
| 4,935,330 | 6/1990 | Hofmann et al. | 430/218 |
| 4,946,373 | 8/1990 | Walls et al. | 430/300 |
| 4,997,745 | 3/1991 | Kawamura et al. | 430/281 |
| 5,049,481 | 9/1991 | Okamoto et al. | 430/283 |
| 5,278,023 | 1/1994 | Bills et al. | 430/201 |
| 5,298,361 | 3/1994 | Bonham | 430/260 |
| 5,320,931 | 6/1994 | Umehara et al. | 430/270 |

FOREIGN PATENT DOCUMENTS 0 529 896 A1   3/1993   European Pat. Off. .

OTHER PUBLICATIONS

Azuma, T. et al, "Photoresist Compositions" Chemical Abstracts vol. 110 No. 66910t, 1989.

*Primary Examiner*—Janet C. Baxter
*Assistant Examiner*—Rosemary Ashton
*Attorney, Agent, or Firm*—Roberts & Mercanti, L.L.P.

[57] ABSTRACT

Provided are 4-(alkoxyhydroxy)styryl triazine photoinitiator compounds having the formula:

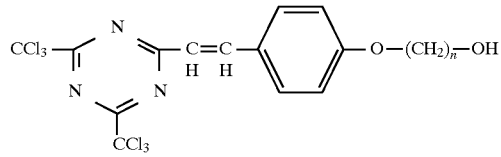

wherein n is 3 or 4, as well as photopolymerizable compositions and photographic elements containing such photoinitiator compounds. These photoinitiator compounds improve the reproduction quality of photographic elements such as lithographic printing plates since the photosensitive compositions in which they are incorporated are resistant to surface blooming.

21 Claims, No Drawings

4-(ALKOXYHYDROXY)STYRYL TRIAZINE PHOTINITIATORS AND PHOTO SENSITIVE COMPOSITION

BACKGROUND OF THE INVENTION

1. Field of the Invention

The present invention relates to photopolymerizable compositions and photographic elements containing such photopolymerizable compositions. More particularly, the invention pertains to photopolymerizable compositions including certain 4-(alkoxyhydroxy)styryl triazine photoinitiator compounds which improve the reproduction quality of photographic elements using the composition. These elements are particularly useful as lithographic printing plates.

2. Description of the Prior Art

It is well known that photographic elements such as lithographic printing plates may be formed by coating a photopolymerizable composition onto a substrate such as a hydrophilized aluminum substrate. A photopolymerizable composition typically contains a free radical generating component such as a photoinitiator, a photopolymerizable component, as well as binders, colorants and other art recognized ingredients. Upon imagewise exposure to actinic radiation, the photoinitiator generates free radicals which initiates the polymerization of the monomer or oligomer in the light struck image areas. Unexposed coating areas are then removed by a developer, resulting in an image of exposed, oleophilic photopolymer against a background of a hydrophilic substrate.

Triazine compounds are well known in the art as compounds which photoinititiate the polymerization of photopolymerizable components upon exposure to actinic radiation. In this regard, see U.S. Pat. Nos. 3,905,815; 3,954,475 and 3,987,037. However, triazines typically have an undesirable property of blooming or migration and crystallization of the triazine photoinitiator on the surface of the overall photopolymerizable composition. In this regard, please see U.S. Pat. No. 4,826,753 for a discussion of the problem. The latter disclosure proposes a solution by providing particular branched hydroxystyryl triazines. Linear 4-(alkoxyhydroxy) styryl triazines wherein the alkoxy moiety has 2 carbon atoms are known in the art, for example in U.S. Pat. No. 4,476,215, however, these compounds unacceptably bloom. Likewise, the applicant has found that linear 4-(alkoxyhydroxy)styryl triazines wherein the alkoxy moiety has 5 or 6 carbon atoms unacceptably bloom. The present invention has unexpectedly found that certain linear 4-(alkoxyhydroxy)styryl triazines wherein the alkoxy moiety has 3 or 4 carbon atoms tend not to bloom and provide excellent photopolymerizable compositions and photographic elements containing such photopolymerizable compositions.

SUMMARY OF THE INVENTION

The invention provides a 4-(alkoxyhydroxy)styryl triazine photoinitiator compound having the formula:

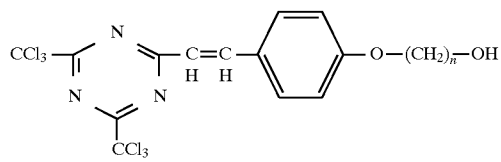

wherein n is 3 or 4.

The invention also provides a photosensitive composition which comprises (a) at least one photopolymerizable monomer, oligomer or polymer compound having at least one olefinically unsaturated double bond, which photopolymerizable compound is present in an amount sufficient to photopolymerize in the presence of a photoinitiator compound (b) upon exposure to sufficient actinic radiation; and (b) the above 4-(alkoxyhydroxy)styryl triazine photoinitiator compound in an amount sufficient to effect photopolymerization of the photopolymerizable compound upon exposure to sufficient actinic radiation.

The invention further provides a photographic element comprising a substrate and the above photosensitive composition on the substrate.

DETAILED DESCRIPTION OF THE PREFERRED EMBODIMENT

The above 4-(alkoxyhydroxy)styryl triazine photoinitiators may be prepared by reacting an appropriate 4-(hydroxyalkoxy) benzaldehyde, with 2,4-bis(trichloromethyl)-6-methyl-1,3,5-triazine. To prepare 2,4-bis(trichloromethyl)-6-[4-(3-hydroxypropoxy)styryl]-1,3,5-triazine (n=3), one reacts 4-(3-hydroxypropoxy)benzaldehyde with 2,4-bis(trichloromethyl)-6-methyl-1,3,5-triazine. To prepare 2,4-bis(trichloromethyl)-6-[4-(4-hydroxybutoxy) styryl]-1,3,5-triazine (n=4), 4-(4-hydroxybutoxy)benzaldehyde is reacted with 2,4-bis(trichloromethyl)-6-methyl-1,3,5-triazine. To prepare 2,4-bis(trichloromethyl)-6-[4-(5-hydroxypentaoxy) styryl]-1,3,5-triazine (n=5), 4-(5-hydroxypentaoxy)benzaldehyde is reacted with 2,4-bis(trichloromethyl)-6-methyl-1,3,5-triazine. An exemplary procedure is shown in Example 1 below.

The thusly prepared triazine photoinitiators may be used by being incorporated into a photosensitive composition including at least one photopolymerizable compound. The photoinitiator may comprise from about 1% to about 50% of the non-solvent parts of the overall composition, or more preferably from about 2% to about 40% and most preferably from about 5% to about 25%

The photopolymerizable compound may be a monomer, oligomer or polymer having at least one and preferably two olefinically unsaturated double bonds. Such are well known in the art. Suitable for use as polymerizable components are ethers, esters and partial esters of acrylic and methacrylic acid and aromatic and aliphatic polyols preferably having 2 to 30 carbon atoms, or cycloaliphatic polyols containing preferably 5 or 6 ring carbon atoms. These polyols can also be modified with epoxides such as ethylene oxide or propylene oxide. The partial esters and esters of polyoxyalkylene glycols are also suitable. Examples are ethylene glycol dimethacrylate, diethylene glycol dimethacrylate, triethylene glycol dimethacrylate, tetraethylene glycol dimethacrylate, polyethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates of polyethylene glycols having an average molecular weight from 100 to 1500, ethylene glycol diallyl ether, 1,1,1-trimethylolpropane triallyl ether, pentaerythritol triallyl ether, diallyl succinates and diallyl adipates or mixtures of the above compounds. Preferred multifunctional acrylate oligomers include, but are not limited to acrylated epoxies such as Interez Corporation's Novacure 3701, acrylated polyurethanes such as Sartomer Co.'s C9505, and acrylated polyesters such as Henkel Corp.'s Photomer 5007. Preferred photopolymerizable polymers include, but are not limited to acrylamido substituted cellulose acetate butyrate and cellulose acetate proprionate available from Bomar; acrylated epoxies available from Echo Resins; acrylated polyesters; acrylated polyethers and acrylated urethanes. A preferred photopolymerizable polymer is Jaylink 106E which is an acrylamido modified cellulose acetate butyrate polymer manufactured by Bomar Specialties. Such are described in U.S. Pat. Nos. 4,557,951 and 4,490,516 which are incorporated herein by reference. These describe a polymerizable cellulosic ester or ether product capable of homopolymerization or co-polymerization with vinyl monomers. They have a degree of substitution of between 2.0 and 2.9 reacted with an acrylamide reactant containing a methylol group to provide a degree of substitution of from about 0.05 to about 0.5 and to provide a degree of hydroxyl substitution of from about 0.05 to about 0.5. Another preferred photopolymerizable component is Sartomer 9041 which is a pentaacrylate ester manufactured by Sartomer. The photopolymerizable compound is present in an amount sufficient to photopolymerize upon exposure to sufficient actinic radiation. In the preferred embodiment, the photopolymerizable compound is present in the overall composition in an amount of from about 1% to about 80% by weight, preferably from about 20% to about 70% based on the non-solvent parts of the overall composition.

The composition preferably further comprises at least one compound selected from the group consisting of phenanthrenequinone, aceanthronenquinone, tetrachloro-1,4-benzoquinone, tetrachloro-1,2-benzoquinone and perinapthenone which acts as a polymerization gate. Phenanthrenequinone is most preferred. The polymerization gate component is present in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above the threshold amount. When it is used, the polymerization gate may comprise from about 0.1% to about 15% by weight of the non-solvent parts of the overall composition, or more preferably from about 0.5% to about 10% and most preferably from about 1% to about 5%.

The photosensitive composition optionally includes a light sensitive diazonium compound such as a light sensitive diazonium polymer. Such diazonium polymers are well known to the skilled artisan and may be formed by condensing a diazonium monomer with a condensing agent in an acidic medium and isolating the condensation product with an anion. Suitable diazonium compounds include those condensed with formaldehyde such as disclosed in U.S. Pat. Nos. 2,063,631 and 2,667,415, the polycondensation products such as disclosed in U.S. Pat. Nos. 3,849,392 and 3,867,147, and the high photospeed and co-condensed diazos such as disclosed in U.S. Pat. No. 4,436,804 and U.S. Pat. No. 4,533,620. A useful diazonium is the polycondensation product of 3-methoxy-4-diazo-diphenyl amine sulfate and 4,4'-bismethoxy-methyl-diphenyl ether, precipitated as the mesitylene sulfonate, such as is taught in U.S. Pat. No. 3,849,392 and which is incorporated herein by reference. Typical diazo compounds are disclosed on pages 194–214 and 321–330 of the volume "Light Sensitive Systems" by Jaromir Kosar, John Wiley & Sons, Inc., New York, 1965. Suitable light sensitive diazonium polymers are isolated as the salts of the condensation product of a suitable monomeric diazonium or mixture of monomeric diazoniums with a suitable condensing agent and which condensed in strong acid. Examples of suitable monomeric diazoniums include but are not limited to p-diazodiphenylamine sulfate; 3-methoxy-4-diazodiphenylamine sulfate; 4-diazo-4'-methoxydiphenylamine sulfate; 2,5-diethoxy-4-diazo-4'-thiotolyl sulfate and combinations thereof Examples of suitable condensing agents include but are not limited to formaldehyde; paraformaldehyde; 4,4-bismethoxymethyldiphenylether; 4,4-bishydroxymethyldiphenylether; 4,4'-bismethoxymethyldiphenylsulfide; 4,4'-bismethoxymethyl bisphenol A and combinations thereof Examples of suitable condensing acids include but are not limited to sulfuric acid, phosphoric acid, trifluoromethyl sulfonic acid and nitric acid. Examples of suitable salt anions used to isolate the condensation products include but are not limited to p-toluenesulfonate, hexafluorophosphate, tetrafluoroboride, mesitylenesulfonate, and trifluoromethlysulfonate. The most preferred diazonium compound is DSO-19 which is the condensation product of 4-diazodiphenylaminesulfate and formaldehyde isolated as the p-tolunenesulfonate and is manufactured by PCAS. The diazonium polymer, when one is used, is present in an amount sufficient to form a photosensitive composition which is substantially sensitive to actinic radiation in the range of from about 300 to about 550 nm. It preferably may comprise from about 0.5% to about 25% of the non-solvent parts of the overall composition, or more preferably from about 1% to about 15% and most preferably from about 5% to about 10%.

In the preferred embodiment, the composition may also contain a polymeric binder to bind the other components into a substantially uniform mixture which can be applied to a substrate. Examples of suitable binders nonexclusively include gelatin, polyvinyl alcohol, polyvinylalcohol copolymers, polyvinyl butyral, acrylic ester polymers and copolymers; polyacrylic acid, polymethacrylic acid, polyethylene oxide, ethylcellulose, polyesters, polystyrene, polyacrylic acid esters, polymethacrylic acid esters, polyvinyl acetal, polyamides, polyacrylonitrile, polyethylene halogenated polyolefins, chlorinated rubber ethylcellulose, cellulose acetate, cellulose nitrate and other homopolymers; and copolymers prepared from various kind of vinyl compounds such as polyvinylacetate and copolymers of polyvinylacetate, polyvinylchloride and copolymers; polyvinylidene chloride polymers and copolymers; vinyl chloride-vinyl acetate copolymer, and styrene-butadiene copolymer. One particularly useful binder is a copolymer of acrylic acid and dimethylmaleimide available as Ronacoat RO-300 from Rohner Ltd., Pratteln, Switzerland. Another useful binder is a carboxylated, acrylated epoxy polymer available as CAE-300 from Echo Resins and Laboratory, Versailles, Mo. The amount of the binder can be experimentally varied by one skilled in the art depending on the desired product characteristics, however they typically comprise from about 1 to about 50% and preferably from about 5 to about 30% of the overall composition by weight.

In the preferred embodiment, photosensitive compositions have a component which improves image visibility after exposure, but before development. Since the inventive triazine are photoacid generators, the overall photosensitive composition preferably includes an anionic xanthene indicator dye which changes color at a pH of about 3 or below and an acrylated amine which prevents premature color change of the dye prior to light exposure. The xanthene dyes suitable for use with the present invention may be characterized by the general formula:

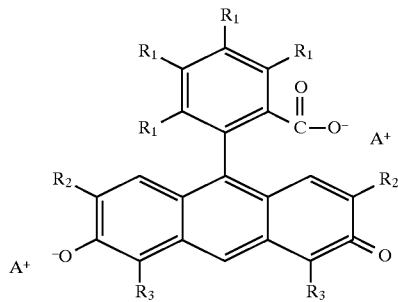

wherein $R_1$ is H or halogen, $R_2$ is H, $NO_2$, CN or halogen, $R_3$ is halogen and $A^+$ is a cation such as Na, K or quaternary ammonium. Preferred xanthene dyes nonexclusively include erythosin B wherein $R_1$ is H, $R_2$ and $R_3$ are iodine and $A^+$ is sodium in the above formula; phloxine B wherein $R_1$ is chlorine, $R_2$ and $R_3$ are bromine and $A^+$ is sodium in the above formula; eosin B wherein $R_1$ is H, $R_2$ is $NO_2$, $R_3$ is iodine and $A^+$ is sodium in the above formula. The most preferred xanthene dye is Rose Bengal wherein $R_1$ is chlorine, $R_2$ and $R_3$ are iodine and $A^+$ is sodium in the above formula. The anionic xanthene dye is present in an amount sufficient to produce a color differentiation upon lowering the pH of the composition responsive to acid generated by exposure of the photoacid generator to actinic radiation. In the preferred embodiment, the amount of xanthene dye which can be used in the photosensitive composition of the present invention ranges from about 0.01% to about 2.0%, more preferably from about 0.05% to about 0.50%, and most preferably from about 0.10% to about 0.30%, by weight based on the weight of the photosensitive composition excluding solvents. Preferably the acrylated amine has the formula

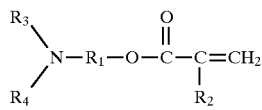

wherein $R_1$ is $C_1$ to $C_{10}$ alkyl, preferably $C_1$ to $C_6$ alkyl or

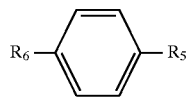

wherein $R_5$ and $R_6$ are independently $C_1$ to $C_{10}$ alkyl, preferably $C_1$ to $C_6$ alky; $R_2$ is H or $-CH_3$, and $R_3$ and $R_4$ are independently H or $C_1$ to $C_{10}$ alkyl, preferably $C_1$ to $C_6$ alkyl. The preferred acrylated amine component is Ebecryl P104 or Ebecryl 7100 available from UCB Radcure, Smyrna, Ga.

The acrylated amine is present in an amount sufficient to hinder loss of color to the photosensitive composition from the dye prior to exposure to actinic radiation but permitting a color differentiation upon lowering of the pH of the composition responsive to acid generated by exposure of the photoacid generator to actinic radiation. In the preferred embodiment, the amount of is acrylated amine which is used in the photosensitive composition of the present invention ranges from about 0.10% to about 5.0%, more preferably from about 0.05% to about 2.0%, and most preferably from about 0.10% to about 0.50%, by weight based on the weight of the photosensitive composition excluding solvents.

Colorants, such as dyes and organic and inorganic pigments are commonly used to impart color to coatings. Color is a desired characteristic of a photosensitive coating for printing plates. The color allows inspection of the printing plate for coating defects and uniformity of the coating before use. After the plate is imagewise exposed and the unexposed coating is removed by development, color in the exposed coating remaining on the plate provides visible discrimination between exposed, imaged areas of the plate and the unexposed, non-imaged areas of the plates. However care should be taken to avoid certain dyes and pigments known in the art to exert a desensitization effect upon light sensitive compositions. Useful colorants non-exclusively include dyes such as Victoria Pure Blue BO (Basic Blue 7, CI 42595) available as BASF Flexo Blue 636 from BASF Corp. of Parsippany, N.J., Rhodamine, Chalcozine, Victoria Blue and methyl violet and pigments such as the anthraquinone and phthalocyanine types. Perylene maroon, phthalo cyanine blue, phthalo cyanine green and cadmium red are similarly useful. Generally, the colorant is in the form of a pigment dispersion which comprises a mixture of one or more pigments dispersed in a suitable dispersant. The pigment will comprise about 20 to about 80% of the pigment dispersion, preferably about 40 to about 60%. Examples of suitable dispersants to be used include but are not limited to polyvinylbutyral, polyvinylformal, cellulose esters, polyurethanes and epoxies. The dispersant will comprise 20 to 80% of the pigment dispersion, preferably 40 to 60%. A preferred colorant is 79S26C chip which is a dispersion of 60% phthalocyanine blue pigment (Pigment Blue 15:4) in Monsanto Butvar B-98 (polyvinylbutyral polymer) and is available commercially from Penn Color Inc. The 79S26C chip produces a blue color in the photocoat. Such dispersions are described in U.S. Pat. No. 5,286,594 which is incorporated herein by reference. A suitable amount of the colorant which can be used ranges from about 0.01% to about 25%, preferably 0.1% to 15%, by weight based on the weight of the composition excluding solvents of this invention. Another preferred component is an exposure indicator such as metanil yellow (phenylazodiphenylamine, 4-sulfonic acid sodium salt). This is a pH sensitive dye which produces a dye image in conjunction with the acid produced by the diazonium. Another preferred component is UCB Ebecryl P104, a reactive, tertiary amine from UCB Radcure, Smyrna, Ga. which acts as a pH controller. The coating may optionally contain a component such as stearic acid which is useful for reducing the effects of oxygen inhibition.

The components of the above composition may be combined by mixing them together in a suitable solvent medium. Solvents which can be used in preparing the photopolymerizable composition of this invention include alcohols such as methanol, ethanol, propanol, butanol, benzyl alcohol and phenoxyethanol; ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate, methyl Cellosolve acetate, ethylene glycol monoethyl ether acetate and ethyl lactate; aromatic hydrocarbons such as toluene, xylene, benzene, ethylbenzene; halogenated hydrocarbons such as carbon tetrachloride, trichloroethylene, chloroform, 1,1,1-trichloroethane, 1,2-dichloroethane, monochlorobenzene, chloronaphthalene; ethers such as tetrahydrofuran, diethyl ethers, ethylene glycol monoethyl ether, ethylene glycol monomethyl ether, propylene glycol monomethyl ether, etc., dimethylformamide, dimethyl sulfoxide, N-vinyl pyrrolidone, etc., and mixtures thereof. The most preferred solvents are ethyleneglycol monomethylether, ethyleneglycol monoethylether and dimethyl formamide which dissolve the other components of the photographic coating. A suitable amount of the solvent which can be employed in the photopolymerizable composition of this invention ranges from about 50% to about 1,000%, preferably 70% to 500%, by weight of the total non-solvent parts of the composition.

Various optional additives may be added to the composition depending on the purpose of the end-use of the light-sensitive composition and other various conditions. Examples of these include thermal polymerization inhibitors, plasticizers and others.

Examples of suitable thermal polymerization inhibitors include hydroquinone, hydroquinone monomethyl ether, catechol, beta-naphthol, mono-t-butylhydroquinone, pyrogallol, 4-tert-butylphenol, 2,5-di-tert-butylhydroquinone or 2,6-di-tertbutyl-4-methylphenol. A suitable amount of the thermopolymerization inhibitor which can be used ranges from about 0.01% to about 5%, preferably 0.1% to 3%, by weight, based on the weight of the non-solvent parts of the composition. Examples of suitable plasticizers include dioctyl phthalate, dibutyl phthalate, butyl phthalyl, butyl glycolate, tricresyl, phosphate, polyester series plasticizers and chlorinated paraffins. A suitable amount of the plasticizer can range from about 0.1% to about 20%, preferably 1% to 10%, by weight based on the weight of the non-solvent parts of the composition.

In order to construct the photographic elements of the present invention, the light sensitive composition is coated onto a suitable substrate and dried. Suitable substrates include aluminum alloys, silicon and polymeric film bases such as polyethylene terephthalate and cellulose acetate butyrate. The most preferred substrate is a lithographic grade aluminum alloy which may have had art recognized surface treatments performed on it. When such is the case, a sheet metal substrate, preferably aluminum and the alloys thereof especially those aluminum compositions suitable for the manufacture of lithographic printing plates such as Alcoa 3003 and Alcoa 1100, which may or may not have been pre-treated by standard techniques as are well known in the art, may be treated by spraying, brushing, dipping or other means with a composition suitable for use as a hydrophilizing interlayer for lithographic plates. Standard metal substrate pretreatments include chemical etching, chemical, electrochemical or mechanical graining and anodizing by methods which are known to the skilled worker. A grain may be imparted to the aluminum surface by wire brushing or a pumice slurry or electrochemically grained in nitric acid followed by desmutting. Anodizing may be performed by electrolytically treating the coated substrate in an aqueous solution of sulfuric, chromic, or phosphoric acid having a concentration of from about 0.5 to 25% by weight of acid in water. Anodizing preferably takes place in a bath maintained at a temperature of from about 15° C. to 35° C. for about from 1 to about 20 minutes at about from 5 to 20 volts and at a current density of about from 10 to 70 amperes per square foot. The foregoing techniques are well known in the art.

The substrate may be treated with an aqueous solutions of a hydrophilizing compound such as alkali silicate, silicic acid, the Group IV-B metal fluorides, the alkali metal salts, polyvinyl phosphonic acid, polyacrylic acid, the alkali zirconium fluorides, such as potassium zirconium hexafluoride, or hydrofluozirconic acid in concentrations of 0.5 to 20% by volume. A preferred concentration range is from 3 to 8% and the most preferred range is from 4 to 5%.

Next, the light sensitive composition of this invention may be coated onto the substrate and dried. The coating is preferably applied to a properly prepared lithographic plate substrate by any well known coating technique and the solvents are evaporated to yield a dry coating weight of 0.70±0.05 grams per square meter. The thusly produced photographic element may then be exposed to ultraviolet or actinic radiation, such as in the 300 to 550 nanometer range through a photographic mask and developed. Suitable uv light sources are carbon arc lamps, xenon arc lamps, mercury vapor lamps which may be doped with metal halides (metal halide lamps), fluorescent lamps, argon filament lamps, electronic flash lamps and photographic floodlight lamps. Exposure is conducted to provide sufficient actinic energy to the element to permit photopolymerization of the photopolymerizable compound in the image areas where the light sensitive composition is exposed through a mask and yet substantially prevent photopolymerization of the photopolymerizable compound in the nonimage areas. The nonimage areas are then removed with a suitable developer.

Typical developer compositions can be alkaline or neutral in nature and have a pH range of from about 5 to about 9. Developers are preferably formed from aqueous solutions of phosphates, silicates or metabisulfites. Such non-exclusively include mono-, di- and tri- alkali metal phosphate, sodium silicate, alkali metal metasilicate and alkali metabisulfite. Alkali metal hydroxides may also be used although these are not preferred. The developers may also contain art recognized surfactants, buffers and other ingredients.

The following non-limiting examples serve to illustrate the invention. It will be appreciated that variations in proportions and alternatives in elements of the components of the photosensitive coating composition will be apparent to those skilled in the art and are within the scope of the present invention.

EXAMPLE 1

Preparation of 2,4-bis(trichloromethyl)-6-[4-(3-hydroxypropoxy)styryl]-1,3,5-triazine (Triazine 133-38, n=3)

68 grams of 4-(3-hydroxypropoxy) benzaldehyde (0.38 moles) and 115 grams of 2,4-bis(trichloromethyl)-6-methyl-1,3,5-triazine (0.35 moles) were dissolved in 800 ml of ethanol. 10 grams of piperidine and 8.5 grams of acetic acid are added and the reaction mixture is refluxed for 8 hours. The solvent is stripped from the reaction mixture. The crude product is recrystallized from 400 ml of isopropanol, yielding 73 grams of product.

In a similar manner, 2,4-bis(trichloromethyl)-6-[4-(2-hydroxyethoxy)styryl]-1,3,5-triazine (triazine 133-93, n=2) is prepared from 4-(2-hydroxyethoxy)benzaldehyde, 2,4-bis(trichloromethyl)-6-[4-(4-hydroxybutoxy) styryl]-1,3,5-triazine (triazine 138-65-A, n=4) is prepared from 4-(4-hydroxybutoxy)benzaldehyde;

2,4-bis(trichloromethyl)-6-[4-(5-hydroxypentaoxy) styryl]-1,3,5-triazine (n=5) is prepared from 4-(5-hydroxypentaoxy)benzaldehyde; and 2,4-bis(trichloromethyl)-6-[4-(6-hydroxyhexoxy)styryl]-1,3,5-triazine (triazine 138-65-B, n=6) is prepared from 4-(6-hydroxyhexoxy)benzaldehyde.

The melting points of the triazines are as follows:

| Triazine | n | Melting Point |
|---|---|---|
| 133–93 | 2 | 178.0–74.1° C. |
| 133–38 | 3 | 130.5–133.3° C. |
| 138–65-A | 4 | 120.7–122.5° C. |
| BK317–26 | 5 | 130–134° C. |
| 138–65-B | 6 | 114.4–115.9° C. |

DSC traces for these triazines show two melting point transitions for triazine 133-38 (n=3) and 138-65-A (n=4). Triazines 133-93 (n=2) and 138-65-B (n=6) show only single melting point transitions.

EXAMPLE 2

This example shows the use of the triazines in photopolymerizable printing plate coating compositions and their migration/blooming properties. The following printing plate coatings are prepared from the above described triazines:

| Component | A | B | C | D | E |
|---|---|---|---|---|---|
| Solvent | 96.01 | 96.02 | 96.00 | 95.99 | 95.98 |
| Bomar Jaylink 106E | 0.56 | 0.56 | 0.56 | 0.56 | 0.56 |
| Sartomer SR9041 | 1.95 | 1.95 | 1.95 | 1.95 | 1.95 |
| Metanil Yellow | 0.11 | 0.11 | 0.11 | 0.11 | 0.11 |
| Triazine 133–38 | 0.32 | — | — | — | — |
| Triazine 133–93 | — | 0.31 | — | — | — |
| Triazine 138–65-A | — | — | 0.33 | — | — |
| Triazine BK317–26 | — | — | — | 0.34 | — |
| Triazine 138–65-B | — | — | — | — | 0.35 |
| Penn Color 79S26C | 0.68 | 0.68 | 0.68 | 0.68 | 0.68 |
| PCAS DSO-19 | 0.37 | 0.37 | 0.37 | 0.37 | 0.37 |
| | 100.00 | 100.00 | 100.00 | 100.00 | 100.00 |

Solvent can be any appropriate solvent for the coating components such as methyl cellosolve, cellosolve, dimethyl formamide, benzyl alcohol, phenoxyethanol, methyl lactate, etc. or appropriate blends of these solvents. Bomar Jaylink 106E is an acrylamido substituted cellulose acetate butyrate polymer manufactured by Bomar Specialties Co. and functions as the binder in the coatings. Sartomer SR-9041 is an ester of dipentarerythritol pentaacrylate manufactured by Sartomer Corp. and is the polymerizable component of the coatings. Metanil yellow, Acid Yellow 36, CI 13065, is employed in the coating as an exposure indicator dye. Penn color 79S26C is a dispersion of 60% phthalocyanine blue pigment in a polyvinylbutyral polymer. PCAS DSO-19 is the condensation product of formaldehyde and 4-diazodiphenylamine sulfate isolated as the p-toluenesulfonate salt and functions as the diazonium component in the coating.

The coatings are applied to grained, anodized and silicated aluminum and the solvents removed to achieve a dry coating weight of 0.65+0.05 g/m². The resulting plates are exposed through appropriate test targets to a NuArc HT-121 mercury arc exposure lamp in an appropriate vacuum frame for 13 units. The plates are developed with Anitec SP negative plate developer.

Exposure through a Stouffer 21 step exposure guide produces a solid step 5 to 6 and exposure through a UGRA 1982 test target reproduces 8 to 10 micron rings and 2% to 98% dots on all the plates. The solvent resistance is measured by 20 back and forth rubs with a cotton wipe saturated with benzyl alcohol. All plates exhibit excellent solvent resistance. The plates are evaluated for migration/blooming properties of the triazine photoinitiator by abrading the surface of the coating and viewing the plate surface. Within 7 days, plates B, D and E exhibit a powder on the surface of the plate. Analysis of the powder confirmed the powder to be the triazine photoinitiator. After 15 months, no powder is seen on the surface of plates A and C, indicating the non-blooming properties of the triazine whose structure has x=3 or 4.

EXAMPLE 3

The following printing plate coatings are prepared from the described triazines

| Component | A | B | C | D | E |
|---|---|---|---|---|---|
| Solvent | 95.83 | 95.84 | 95.82 | 95.81 | 95.80 |
| Goodrich Estane 5715 | 0.82 | 0.82 | 0.82 | 0.82 | 0.82 |
| Echo Acrylated Epoxy | 0.16 | 0.16 | 0.16 | 0.16 | 0.16 |
| Sartomer 9041 | 1.51 | 1.51 | 1.51 | 1.51 | 1.51 |
| Metanil Yellow | 0.12 | 0.12 | 0.12 | 0.12 | 0.12 |
| Triazine 133–38 | 0.40 | — | — | — | — |
| Triazine 133–93 | — | 0.39 | — | — | — |
| Triazine 138–65-A | — | — | 0.41 | — | — |
| Triazine BK317–26 | — | — | — | 0.42 | — |
| Triazine 138–65-B | — | — | — | — | 0.43 |
| Penn Color 79S26C | 0.75 | 0.75 | 0.75 | 0.75 | 0.75 |
| PCAS DSO-19 | 0.41 | 0.41 | 0.41 | 0.41 | 0.41 |
| | 100.00 | 100.00 | 100.00 | 100.00 | 100.00 |

Goodrich Estane 5715 is a polyurethane polymer manufactured by B. F. Goodrich. Echo acrylated epoxy is an acrylated epoxy polymer manufactured by Echo Resins and Laboratories.

The coatings are employed as in Example 2 to prepare plates, which are exposed and developed as described in Example 2. All plates produce solid steps, reproduction quality and solvent resistance similar to the plates of Example 2. The plates of this example were tested for triazine photoinitiator migration and blooming like the plates of example 2. A crystalline powder is seen on the surface of plates B, D and E after 16 days. No powder is seen on plates A or C. Plate A was mounted on a Diddie-Glazer web feed press and produced in excess of 100,000 high quality impressions. In these examples the quantities of each triazine within the coating of each example is slightly different. The triazines were employed in equimolar quantities, and the differences reflect the differences in molecular weight for the triazines.

What is claimed is:

1. A 4-(alkoxyhydroxy)styryl triazine photoinitiator compound having the formula:

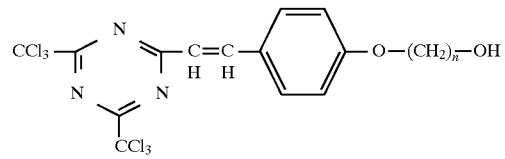

wherein n is 3 or 4.

2. The compound of claim 1 wherein n is 3.

3. The compound of claim 1 wherein n is 4.

4. A photosensitive composition which comprises (a) at least one photopolymerizable monomer, oligomer or polymer compound having at least one olefinically unsaturated double bond, which photopolymerizable compound is present in an amount sufficient to photopolymerize in the presence of a photoinitiator compound (b) upon exposure to sufficient actinic radiation; and (b) at least one 4-(alkoxyhydroxy)styryl triazine photoinitiator compound having the formula:

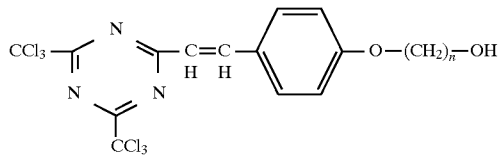

wherein n is 3 or 4, in an amount sufficient to effect photopolymerization of the photopolymerizable compound upon exposure to sufficient actinic radiation.

5. The photosensitive composition of claim 4 wherein n is 3.

6. The photosensitive composition of claim 4 wherein n is 4.

7. The photosensitive composition of claim 4 further comprising a light sensitive diazonium compound in an amount sufficient to photosensitize the composition.

8. The photosensitive composition of claim 7 further comprising a binder in an amount sufficient to bind the composition components in a uniform admixture.

9. The photosensitive composition of claim 4 further comprising a binder in an amount sufficient to bind the composition components in a uniform admixture.

10. The photosensitive composition of claim 4 further comprising (c) a combination of at least one anionic xanthene dye in an amount sufficient to produce a color differentiation upon lowering the pH of the photosensitive composition responsive to acid generated by exposure of the triazine compound to actinic radiation; and at least one acrylated amine in an amount sufficient to hinder loss of color to the photosensitive composition from the xanthene dye prior to exposure to actinic radiation but permitting a color differentiation upon lowering the pH of the photosensitive composition responsive to acid generated by exposure of the triazine compound to actinic radiation;

(d) at least one compound selected from the group consisting of phenanthrenequinone, aceanthronenquinone, tetrachloro-1,4-benzoquinone, tetrachloro-1,2-benzoquinone, perinapthenone and mixtures thereof, in an amount sufficient to substantially prevent photopolymerization of the photopolymerizable compound when the photosensitive composition is exposed to actinic radiation below a threshold amount but to permit photopolymerization of the photopolymerizable compound when the photosensitive composition is exposed to actinic radiation above a threshold amount.

11. The photosensitive composition of claim 10 wherein n is 3, the anionic xanthene dye comprises rose bengal, wherein the acrylated amine has the formula

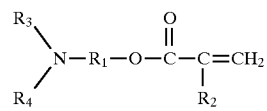

wherein $R_1$ is $C_1$ to $C_6$ alkyl or

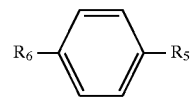

wherein $R_5$ and R6 are independently $C_1$ to $C_6$ alkyl; $R_2$ is H or —$CH_3$ and $R_3$ and $R_4$ are independently H or $C_1$ to $C_6$ alkyl, component (d) is phenanthrenequinone and the photosensitive composition further comprises a binder which comprises a combination of a carboxylated, acrylated epoxy polymer and a copolymer of acrylic acid and dimethylmaleimide.

12. A photographic element comprising a substrate and a photosensitive composition on the substrate, which photosensitive composition comprises (a) at least one photopolymerizable monomer, oligomer or polymer compound having at least two olefinically unsaturated double bonds, which photopolymerizable compound is present in an amount sufficient to photopolymerize in the presence of a photoinitiator compound (b) upon exposure to sufficient actinic radiation; and (b) at least one 4-(alkoxyhydroxy)styryl triazine photoinitiator compound having the formula:

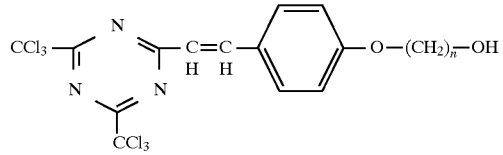

wherein n is 3 or 4, in an amount sufficient to effect photopolymerization of the photopolymerizable compound upon exposure to sufficient actinic radiation.

13. The photographic element of claim 12 wherein n is 3.

14. The photographic element of claim 12 wherein n is 4.

15. The photographic element of claim 12 further comprising a light sensitive diazonium compound in an amount sufficient to photosensitize the composition.

16. The photographic element of claim 15 further comprising a binder in an amount sufficient to bind the composition components in a uniform admixture.

17. The photographic element of claim 12 further comprising a binder in an amount sufficient to bind the composition components in a uniform admixture.

18. The photosensitive element of claim 12 wherein the substrate comprises a component selected from the group consisting of aluminum alloys, silicon and polymeric film bases.

19. The photosensitive element of claim 12 wherein the substrate comprises an aluminum alloy and the surface of the substrate has been pretreated before applying the light sensitive composition, with one or more processes selected from the group consisting of chemical etching, chemical graining, electrochemical graining, mechanical graining, anodizing and hydrophilizing.

20. The photographic element of claim 12 wherein the photosensitive composition further comprises:

(c) a combination of at least one anionic xanthene dye in an amount sufficient to produce a color differentiation upon lowering the pH of the photosensitive composition responsive to acid generated by exposure of the triazine compound to actinic radiation; and at least one acrylated amine in an amount sufficient to hinder loss of color to the photosensitive composition from the xanthene dye prior to exposure to actinic radiation but permitting a color differentiation upon lowering the pH of the photosensitive composition responsive to acid generated by exposure of the triazine compound to actinic radiation;

(d) at least one compound selected from the group consisting of phenanthrenequinone, aceanthronenquinone, tetrachloro-1,4-benzoquinone, tetrachloro-1,2-benzoquinone, perinapthenone and mixtures thereof, in an amount sufficient to substantially prevent photopolymerization of the photopolymerizable compound when the photosensitive exposed to actinic radiation below a threshold amount but to permit photopolymerization of the photopolymerizable compound when the photosensitive exposed to actinic radiation above a threshold amount.

21. The photographic element of claim 20 wherein n is 3, the anionic xanthene dye comprises rose bengal, wherein the acrylated amine has the formula

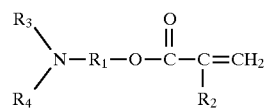

wherein $R_1$ is $C_1$ to $C_6$ alkyl or

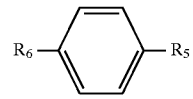

wherein $R_5$ and $R_6$ are independently $C_1$ to $C_6$ alkyl; $R_2$ is H or —$CH_3$, and $R_3$ and $R_4$ are independently H or $C_1$ to $C_6$ alkyl, component (d) is phenanthrenequinone and the photosensitive composition further comprises a binder which comprises a combination of a carboxylated, acrylated epoxy polymer and a copolymer of acrylic acid and dimethylmaleimide; and the substrate comprises aluminum.

* * * * *